(12) United States Patent
Verma et al.

(10) Patent No.: US 7,732,777 B2
(45) Date of Patent: Jun. 8, 2010

(54) PLASMON ENERGY CONVERTER

(75) Inventors: Ravi Verma, Pasadena, CA (US); Mark Luitzen Brongersma, Redwood City, CA (US)

(73) Assignee: Tanner Research, Inc., Monrovia, CA (US)

( * ) Notice: Subject to any disclaimer, the term of this patent is extended or adjusted under 35 U.S.C. 154(b) by 25 days.

(21) Appl. No.: 11/715,793

(22) Filed: Mar. 8, 2007

(65) Prior Publication Data

US 2008/0217542 A1 Sep. 11, 2008

Related U.S. Application Data

(60) Provisional application No. 60/779,587, filed on Mar. 6, 2006.

(51) Int. Cl.
*G01T 1/24* (2006.01)
*G01J 1/00* (2006.01)
(52) U.S. Cl. ............................... 250/370.01; 250/336.1
(58) Field of Classification Search ............ 250/370.01, 250/336.1
See application file for complete search history.

(56) References Cited

U.S. PATENT DOCUMENTS

| 7,177,515 | B2* | 2/2007 | Estes et al. ................... | 385/130 |
| 2007/0194357 | A1* | 8/2007 | Oohashi et al. ............. | 257/292 |
| 2007/0278607 | A1* | 12/2007 | Gruhlke et al. .............. | 257/458 |

* cited by examiner

*Primary Examiner*—David P Porta
*Assistant Examiner*—Mindy Vu

(57) ABSTRACT

An energy converter employing plasmons. In a specific embodiment, a receiver receives a first type of energy or signal and provides one or more plasmons in response thereto. A detector is coupled to the receiver. The detector converts the one or more plasmons into a second type of energy or signal. In a more specific embodiment, the first type of energy or signal includes incident electromagnetic energy, such as visible, infrared, or ultraviolet radiation. The second type of energy or signal includes an electrical signal. The receiver includes a conductor grating that is coupled to a dielectric material. Examples of the detector includes a pn-junction and an interfacial bandgap junction. The receiver and the detector are coupled so that the one or more plasmons form a plasma wave as they travel from the receiver to the detector.

17 Claims, 6 Drawing Sheets

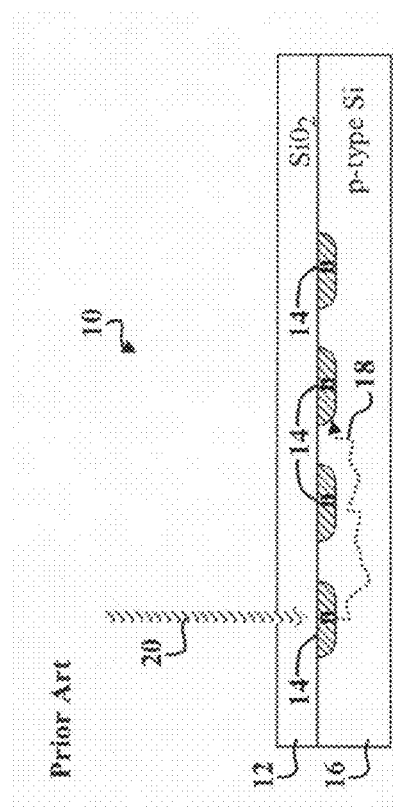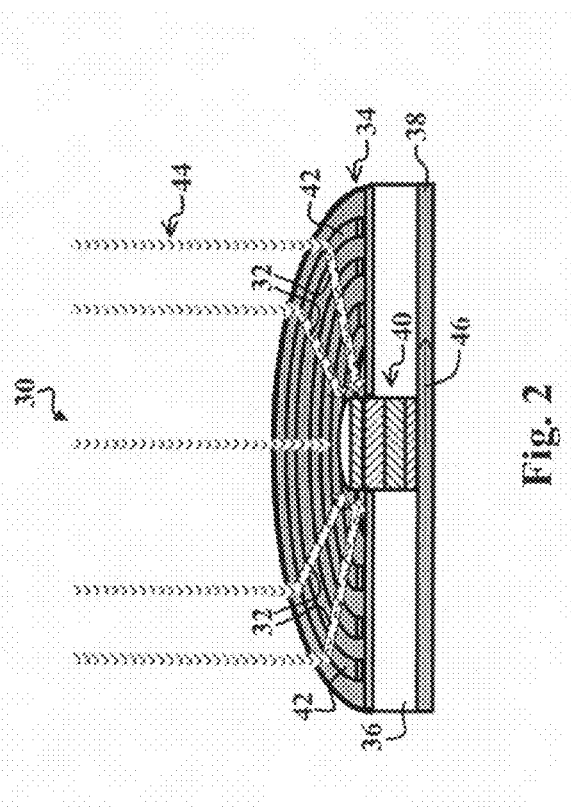

PLASMON ENERGY CONVERTER

CLAIM OF PRIORITY

This invention claims priority from U.S. Provisional Patent Application Ser. No. 60/779,587, entitled ENHANCED PHOTODIODES WITH LENSING DUE TO EXTRAORDINARY TRANSMISSION, AND/OR SURFACE PLASMON/PHONON RESONANCE AND/OR RESONANT NANOHOLES, filed on Mar. 6, 2006, which is hereby incorporated by reference as if set forth in full in this specification.

BACKGROUND OF THE INVENTION

1. Field of Invention

This invention relates to energy converters. Specifically, the present invention relates to devices, such as photodetectors, photoconductors, and arrays thereof, for converting incident electromagnetic energy into plasma waves and/or electrical signals.

2. Description of the Related Art

Energy detectors are employed in various demanding applications including digital cameras, missile-guidance systems, motion detectors, radar receivers, microwave dishes, and other types of antennas. Such applications often demand efficient detectors that can effectively absorb incoming energy and provide a corresponding electrical signal with minimal noise and energy loss.

High-performance detectors are particularly important in detector-array applications used for imaging applications, where detector performance greatly affects image quality. An example detector array includes several closely spaced photodiodes. Incident light causes the photodiodes to output electrical current representative of the incident light. The conversion from light to electricity is called phototransduction, and a photodiode detector is often called a phototransducer.

Incident light on a detector surface yields electron-hole pairs in the detector, which result in the electrical current. Unfortunately, certain electron-hole pairs are generated via heat or other processes, and certain electron-hole pairs spontaneously combine. These processes contribute to noise or output signal degradation.

To reduce noise associated with a given detector in a detector array, detectors are shrunk. Unfortunately, as the size and spacing between detectors in an array decrease, the detectors may become less efficient at absorbing specific wavelengths of electromagnetic energy. Furthermore, interference or cross_talk between detectors may increase. Such factors have limited minimum detector sizes. Unfortunately, large detectors may undesirably limit resolution of accompanying imaging systems.

To further tune the performance of a detector array, certain polarization filters, waveguides, or other optics are positioned in front of the detector array. However, such mechanisms are often prohibitively expensive and may introduce undesirable artifacts in the resulting array output.

Hence, a need exists in the art for a versatile, low-noise, small detector that may reduce or eliminate the need for expensive filters and optics and that may increase the resolution and performance of an accompanying detector array.

SUMMARY OF THE INVENTION

The need in the art is addressed by an energy converter that includes, in one example embodiment, a receiver for receiving a first type of energy or signal and providing one or more plasmons in response thereto. A detector is coupled to the receiver, wherein the detector is adapted to convert the one or more plasmons into a second type of energy or signal. For the purposes of the present discussion, a receiver may be any device capable of receiving energy, such as incident electromagnetic energy.

In a more specific embodiment, the first type of energy or signal includes incident electromagnetic energy, such as visible, infrared, or ultraviolet radiation. The second type of energy or signal includes an electrical signal. The receiver includes a conductor grating that is coupled to a dielectric material. The detector includes a pn-junction, which includes an interfacial bandgap. The receiver and the detector are coupled so that the one or more plasmons form a plasma wave as they travel from the receiver to the detector.

The pn-junction is positioned relative to a photo-plasmon converter so that generation of electron-hole pairs in the pn-junction is confined to a depletion region of the pn-junction. The interfacial bandgap is tunable, thereby enabling adjustments to the responsiveness of the energy detector to certain wavelengths of electromagnetic energy. Adjustments in detector output response to different polarizations, incident angles, and wavelengths of incident electromagnetic energy may occur by manipulating grating geometry.

In another embodiment, the detector is incorporated in a superpixel, which is a group of detectors. The superpixel includes detectors that are responsive to different frequencies, different incident angles, and/or different polarizations, of incident electromagnetic energy. The superpixel may be further incorporated in an array of superpixels.

The novel design of certain embodiments discussed herein is facilitated by use of plasmons to facilitate coupling incident electromagnetic energy into an electrical signal. The plasmons may be manipulated to enable use of smaller detector elements; to focus and confine energy into low-noise regions of an accompanying detector element; to enable adjustments in detector sensitivity to wavelength, incident angle, and polarization, without the need for expensive filters or optics; and so on.

BRIEF DESCRIPTION OF THE DRAWINGS

FIG. 1 is a diagram of a conventional photodetector array, illustrating undesirable cross_talk between detector elements. Ref: Kamins T I, & Fong G T, IEEE Trans. El. Dev. 1978, 25(2), 154.

FIG. 2 is a diagram of a detector employing plasmons according to a first example embodiment of the present invention.

DESCRIPTION OF THE INVENTION

Figure 3:
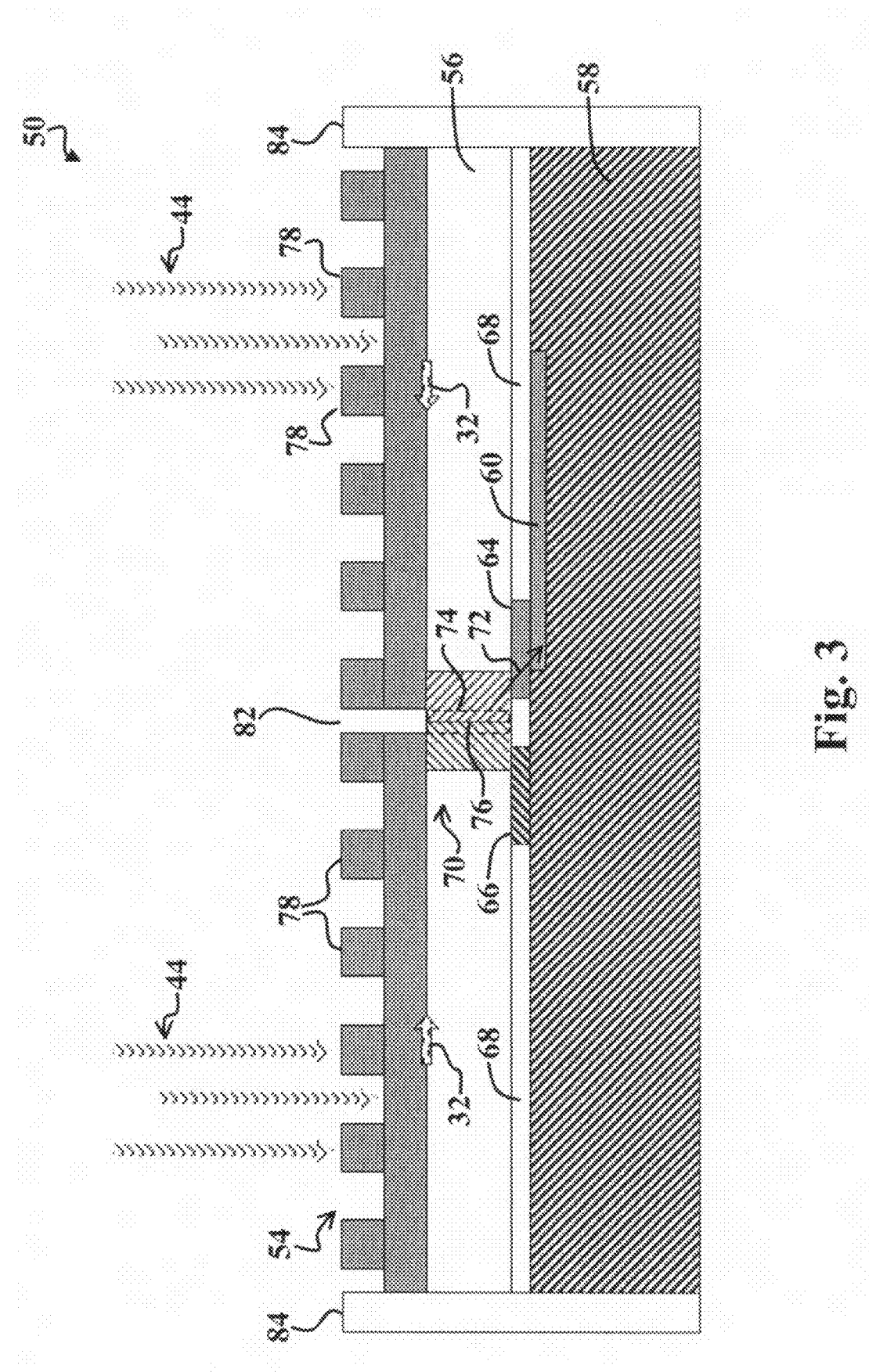
FIG. 3 is a cross-sectional diagram of a detector according to a second example embodiment of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

In an example photodiode, an active layer absorbs incident photons, thereby generating an electron-hole pair. This electron-hole pair migrates to collecting electrodes by the processes of drift and diffusion; when they are collected by the appropriate electrodes, they generate a current (or voltage) in appropriate circuitry. The current level (or voltage level) is proportional to the intensity of incident light. Accordingly, an array of photodiodes is capable of imaging.

The phototransduction process (generation & collection of electron-hole pairs from incident photons) is complicated by thermal generation of electron-hole pairs, and by other noise sources (such as generation-recombination noise) that limit photodiode performance. Certain embodiments disclosed herein may represent photodiode architectures wherein noise generation is suppressed through the reduction of the volume of the active region within the phototransducer.

Furthermore, the performance of an array of photodiodes is affected by the collection efficiency of the photo-generated electron-hole pairs. This issue can manifest in many ways. For example, an electron that is photogenerated (or thermally generated) outside the depletion region of an n/p diode may diffuse randomly, with the diffusion length scale defined by material characteristics. Accordingly, when the spacing between two adjacent photodiodes in the imager is reduced to less than the diffusion length scale, the random diffusion of the electrons results in a smearing and a corresponding loss of resolution.

Certain embodiments disclosed herein may represent photodiode architectures wherein the generation of electron-hole pairs outside of the depletion region is eliminated, thereby enabling imagers with reduced pixel pitch.

In a certain class of phototransducers, the nominal bandgap characterizing a phototransducer is interfacial. For example, holes generated by photoabsorption in one material are carried across the interface of an adjacent material. An advantage of such phototransducers includes the fact that the nominal bandgap can be tuned to a wide range of values. The nominal bandgap may be the difference between the Fermi level in one material and the valence band in the other material. Hence, by tuning the doping levels and composition and the bias voltage, the nominal bandgap, and consequently, the spectral response, of such phototransducers can be adjusted. A disadvantage of such materials is that they may suffer from very poor quantum efficiencies, as the quantum efficiency is limited by the fact that only photons absorbed within one hole diffusion length scale of the interface result in a photocurrent. Holes generated further away are lost due to a hole-hole recombination process.

Certain embodiments disclosed herein may represent photodiode architectures wherein the absorption of photons within one hole diffusion length scale of the interface of a heterojunction detector is enhanced.

Imaging capabilities of a detector array may be enhanced if incident photons are also sorted by an appropriate combination of polarization and wavelength. For instance, man-made objects may have radically different polarization signatures than natural objects. Conventionally, to sort incident photons by wavelength and polarization, additional polarization and wavelength filters are positioned on the front end of a focal plane or imager array. This method is commonly applied in color digital cameras, wherein imager pixels are mated with an array of color pixels of red, blue and green wavelengths. However, this method may result in loss of photons, since certain photons of the incorrect wavelength and/or polarization are prevented from reaching the detector pixel. This photon loss may negatively impact the signal-to-noise ratio of a detector array. Furthermore, such methods may require some data extrapolation, since no two wavelength/polarization combinations can be collected from the exact same location at the same point in time.

Certain embodiments disclosed herein and discussed more fully below may represent a detector architecture that can collect incident light information binned by wavelength and/or polarization from the same location and at the same instant in time.

Certain needs in the art are addressed by a new photodiode architecture that is enhanced by plasmonics. Plasmons may represent collective oscillations of electrons or other charges at a metal/dielectric interface. Plasmons may be visualized as quasiparticles similar to photons. Under appropriate conditions, plasmons can be coupled from photons, and plasmons can, in turn, be coupled into electron-hole pairs.

Certain embodiments disclosed herein exploit a photon-plasmon-electron transduction mechanism instead of a direct photon-electron transduction mechanism employed by certain conventional photodiodes. In certain illustrative embodiments, a plasmon-enhanced photodiode is adapted for use as a light detector with reduced noise; as a light detector in an array with a reduced pixel pitch; as a light detector employing a heterointernal photoemission mechanism or other interfacial mechanism with increased quantum efficiencies; and as a light detector responsive to incident photons only within a certain range of incidence angles and/or directions.

In certain embodiments disclosed herein, incident electromagnetic energy is first coupled into plasmons, such as at a metal-dielectric interface. The photon-plasmon coupling efficiency may be a function of the material refractive indices, such as of the metal and of the dielectric; the dimensions of the metal (and of any structures present in the metal); and of the incident angle, polarization, and wavelength of the incident photon. Hence, in certain specific embodiments, the details of the photon-plasmon coupling process are manipulated so as to impart desired properties to an accompanying energy detector. Furthermore, energy associated with a plasmon wave may be concentrated into a much smaller volume than the energy associated with the photon, as the plasmon energy is concentrated near the metal-dielectric interface. This concentration of plasmon energy can be used to impart additional desirable properties to the plasmon-enhanced photodiode, as discussed with reference to specific embodiments.

For clarity, various well-known components, such as voltage sources, imaging circuits, and so on, have been omitted from the figures. However, those skilled in the art with access to the present teachings will know which components to implement and how to implement them to meet the needs of a given application.

The following review of a conventional photodetector array is intended to facilitate an understanding of the present invention and benefits afforded thereby.

FIG. 1 is a diagram of a conventional photodetector array 10, illustrating undesirable cross talk between detector elements 12, 14. The detector array 10 includes a transparent glass (SiO$_2$) window 12 disposed on a silicon substrate 14, 16, which includes n-type regions 14 surrounded by a p-type region 16. Interfaces, called pn-junctions, between the n-type regions 14 and the p-type region 16 form active detector elements for detecting incident light 20. The region around the interface is called the depletion region.

In operation, the incident light 20 causes the generation of electrons and holes at each detector element 14, 16 yielding an electric current. Unfortunately, electrons or holes created outside the depletion region at one detector element may migrate to another detector element via a random path 18 through the p-type silicon 16. This migration represents detector cross talk, which can interfere with the electrical response of a given detector element 14, 16.

Such holes, often called minority carriers, can diffuse significant distances in a semiconductor substrate. This phenomenon undesirably limits the pixel resolution, also called detector density, of such detector arrays. Furthermore, such crosstalk may reduce the image quality and limit the resolution of accompanying images formed from the output of the detector array 10.

FIG. 2 is a diagram of an energy detector 30 employing plasmons 32 according to a first example embodiment of the present invention. For the purposes of the present discussion, a plasmon may be a particle or quasiparticle representing a collective oscillation of charge. The charge may be manifested as oscillating electrons, holes, or other particles with electrical charges. Note that plasmons typically represent oscillating charges rather than flowing charges. Flowing charges represent electrical current.

The oscillating plasmons 32 represent a plasma wave. A plasma wave, also called a plasmon wave or a plasma oscillation, may be any periodic oscillation of charge density that propagates from one location to another. A plasma wave typically occurs in a conducting medium that is capable of propagating the plasma wave. When a plasma wave is confined to a surface or a region near the surface of a conducting medium, the plasma wave is called a Surface Plasmon Resonance (SPR) wave.

The detector 30, which is disc-shaped, includes a grating structure 34 formed from a plasmon-conducting material (such as gold, copper, aluminium, etc.). The grating structure 34 is positioned on top of an insulating layer 36, which may be a dielectric or wide bandgap material, such as silicon dioxide (SiO$_2$).

For the purposes of the present discussion, a dielectric layer may be any layer that is sufficiently resistant to the flow of electrons, holes, or other charges therein to prevent electrical signals from flowing across the layer. An electrical signal may be an electrical current or voltage or information carried by the voltage or current. An electrical current may be any signal characterized by a flow of electrons or electrical charges or particles with electrical charges. A signal may be any information that is stored or conveyed or may be the means of conveying the information. For example, a beam of electromagnetic energy may be considered a type of signal, and information carried via the beam may also be considered a signal for the purposes of the present discussion. Electromagnetic energy may be any form of energy associated with or including electric and magnetic field components. Examples of electromagnetic energy include microwave beams, thermal radiation, laser light, radio waves, ultraviolet light, and so on. Light may be any form of electromagnetic energy that employs photons to propagate. A conductor or conducting medium may be any material through or on which electromagnetic energy may readily propagate.

A groundplane electrical conductor 38, which may be made from a suitable metal, is coupled to a bottom of the insulating layer 36. An active element 40 is formed in the insulating layer 36, and extends from the grating structure 34 to the groundplane 38, which acts as an electrode, as discussed more fully below. The active element 40, which may be implemented via a pn-junction, is approximately centered in the detector 30 at a plasmon focal point of the grating 34.

For the purposes of the present discussion, an active element may be any device adapted to generate a second signal in response to a first signal. In the present example embodiment, the first signal includes a plasmon signal 32, and the second signal includes an electrical signal 46.

The exact materials used to implement the active element 40 are application specific. For example, when the detector 30 is used to convert optical energy of visible wavelengths into an electrical signal, one or more junctions formed from n-type silicon and p-type silicon may be employed. In infrared applications, a mercury cadmium telluride (HgCdTe) junction may be employed. Other applications involve the conversion of infrared, ultra violet, microwave, and terahertz electromagnetic radiation into electric signals. Terahertz electromagnetic radiation may be any electromagnetic radiation characterized by a frequency greater than 0.1 terahertz.

The grating structure 34 includes various concentric protrusions or ridges 42, which are selectively spaced and dimensioned to achieve desired response characteristics of the detector 30. In the present embodiment, the dimensions of the surface features 42 of the grating structure 34 are chosen to facilitate funneling and focusing plasma waves 32 toward the active element 40. For the purposes of the present discussion, a grating, such as the grating 34, may be any structure with a predetermined pattern or arrangement of physical features.

In operation, the detector 30 acts as an energy converter. An energy converter may be any device or thing that facilitates the conversion of one type of energy or signal into another type of energy or signal.

Incident electromagnetic energy 44 impinges on the grating structure 34, which results in the creation of plasmons or plasma waves 32. Hence, the grating structure 34 effectively converts the incident electromagnetic energy 44 into another type of energy, i.e., plasma waves 32. The grating structure 34 represents a type of photo-plasmon converter. For the purposes of the present discussion, a photo-plasmon converter may be any device capable of converting a photon into a plasmon or capable of converting a beam of photons in to multiple plasmons or plasma waves.

The plasma waves 32 travel along the surface of the grating 34 as SPR waves until they reach the active element 40. The active element 40 converts the plasma waves 32 into an electrical signal. Hence, the active element 40 may also be considered to be a type of energy converter, that converts one form of energy, such as plasmons, into another form of energy, such as an electrical signal. For illustrative purposes, the generated signal is shown as signal 46 traveling in the ground plane 38. The ground plane 38 acts as an electrode for conducting current through the active element 40.

The grating 34 may act as a second electrode. The active element 40 may be electrically biased by applying a predetermined voltage between the groundplane 38 and the grating 34. The bias voltage may be employed to tune the sensitivity of the active element 40 to various frequencies of incident energy 44, 32, by controlling a bandgap at an interface between dissimilar types of materials in the active element 40. A bandgap may represent the energy difference between the valence band in one material and the bottom of the conduction band or a Fermi level in the other material.

The active element 40 acts as a plasmon-electron converter. A plasmon-electron converter may be any device capable of converting one or more plasmons into an electrical current.

By employing the grating 34 to first couple incident electromagnetic energy 30 into plasmons or plasma waves 32, which may then be focused into a small region corresponding to the active element 40, much smaller active elements may be employed than would otherwise be possible. This yields improved noise characteristics and enables tuning of the responsiveness of the detector 30 to different frequency bands, different angles of incidence, and different polarizations of the incident electromagnetic energy 44.

The detector 30 may implement a plasmon-enhanced photodiode, wherein the incident electromagnetic energy 40 includes light. For the purposes of the present discussion, light may be any form of electromagnetic energy that employs photons to propagate.

In an accompanying imaging system, this detector 30 would represent one pixel. Note that while the detector 30 is substantially disc-shaped, other detector shapes, such as square detectors, may be employed to achieve different response characteristics.

The active element 40 may be implemented via various types of photodetectors or photodiodes. In the present specific embodiment, the active element 40 is much smaller than the overall size of the detector 30, and may also be smaller than the wavelength of the incident light 44. This is unlike a conventional detector, which typically must be significantly larger than the wavelength of the incident light 44. The optical energy of the incident light 44 is funneled to the active element 40 via resonant antenna structure, exemplified by the grating 34. Note that the example grating features 42 may be replaced with other features, such as resonance nanoholes, without departing from the scope of the present teachings. Various features of the grating structure 34, such as the ridges 42, are called nanoobjects if their dimensions are much less than the wavelength of incident electromagnetic energy 44 being detected.

Note that the active element 40 may also be replaced with a photoresistor or photoconductor. In addition, the grating 34 may include any number or type of nanoparticles, nanorods, or other features as needed to meet the needs of a given application.

The field of nanotechnology has demonstrated photoconductors and photodiodes with nanoscale dimensions. For the purposes of the present discussion, a device or object is said to have nanoscale dimensions if one or more spatial dimensions of the device or object are smaller than approximately 100 nm.

Conventionally, a nanoscale photodiode, photoconductor, or other detector cannot be used to sense incident light, since such small detectors would be transparent to the incident light, since their characteristic dimension is below the wavelength of the incident light. However, by funneling the optical energy 44, 32 into a smaller volume by using the techniques described here, such nanoscale devices can be effectively used to sense incident light 44.

Plasmon-enhanced photodiodes, which may be implemented via the detector 30 and active element 40, employ the photon-plasmon-electron transduction instead of the photon-electron transduction employed by conventional photodiodes. Collective oscillations of electrons at the interface of a metal and a dielectric, such as the plasmons 32, can be thought of as a quasi wave-particle matter, similar to photons and electrons. Thus, under appropriate conditions, plasmons can be coupled from photons, and the plasmons can be absorbed by an appropriate absorbing medium thereby generating an electron-hole pair. The advantages afforded by the photon-plasmon-electron transduction include that the photon-plasmon coupling can be manipulated to impart desired properties to the photodiode. Furthermore, the plasmon energy is highly concentrated, thereby enabling photon-plasmon-electron transducers with very small dimensions. Thus, certain embodiments disclosed herein can be exploited for many purposes, only a small sample of which are mentioned herein.

Noise in energy detectors or energy converters, such as photodiodes and accompanying arrays of photodiodes, is associated with dark current, shot noise, generation recombination noise, noise due to defects, and so on. The reduction in noise is enabled by a reduction in the active layer volume. For instance, the number of thermally generated electron-hole pairs scales linearly with the active layer volume. Additionally, in some cases, additional nonlinear effects will result in significant noise reductions. For instance, in long wave infrared (LWIR, light of wavelength 8 to 14 microns) photodiodes made of mercury-cadmium-telluride alloys, if all the incident optical energy can be absorbed within 1 diffusion distance of the n/p interface, then a non-equilibrium mode of operation can be invoked to significantly reduce the noise due to Auger mechanisms. Auger mechanisms may dominate the overall noise in a photodiode or other detector at room temperature.

Note that the detector 30 may represent a plasmon-enhanced photodiode suitable for phototransduction noise reduction. Note that incident light 44 is coupled into plasmons and may be funneled into very small central location corresponding to the active element 40. Focusing of the plasmons 32 enables use of smaller active elements for phototransduction than would otherwise be possible.

The general scheme of coupling incident electromagnetic energy, such as electromagnetic radiation, into plasmons and then coupling the plasmons into an electrical signal is not limited to any specific embodiment or implementation. For example, note that the active element 40 may be implemented via hybrid photodiode pixels (for instance, HgCdTe photodiodes used for Medium Wave IR (MWIR) and Long Wave IR (LWIR) detection).

The grating 34 may be constructed from a metal film deposited on top of the insulating layer 36. The exact thickness of the grating 34 or associated film is application-specific.

FIG. 3 is a cross-sectional diagram of a detector 50 according to a second example embodiment of the present invention. The detector 50, which is a type of energy converter, includes an alternative grating 54, which is deposited atop a dielectric layer 56. For illustrative purposes, the dielectric layer 56 is shown bump-bonded to a Read Out Integrated Circuit (ROIC) substrate 58, upon which is disposed an integrated circuit 60. Bump bonds 64, 66 create a space 68 between the insulating layer 56 and the ROIC substrate 58. A diode 70 is formed in the insulating layer 56 and extends from the grating 54 to the bump-bonds 64, 66. For illustrative purposes, one of the bump bonds 64 is shown acting as an electrode for conducting an electrical signal 72 from a depletion region 74 of the diode 70. In the present example embodiment, the diode 70 includes a pn-junction 76 characterized by an interfacial bandgap.

The bandgap associated with the pn-junction 76 is voltage-tunable in that the bandgap may be changed by selectively applying a bias voltage across the pn-junction 76, such as via the bump electrode 64 and the grating 54. In the present embodiment, the diode 70 is a nanoscale diode, and various grating features 78 are nanoscale features. Accordingly, the detector 50 is also called a nanoscale interfacial bandgap energy detector.

For the purposes of the present discussion, a pn-junction may be any device that includes a p-type semiconductor material adjacent to an n-type semiconductor material or may be the interface between the p-type semiconductor material and the n-type semiconductor material. An interfacial bandgap region may be any region wherein different adjacent materials exhibit different energy bands such that a hole generated in a first material may jump from an energy band in the first material to an energy band or state in the second material, which is adjacent to or otherwise interfaced with the first material.

The grating 54 includes strategically shaped, sized, and spaced surface features 78, including a central perforation 82 extending from the pn-junction 67 through the grating 54. The size, shape, and spacing of the grating features 78 may be employed to select a particular polarization, to select a particular frequency or range of frequencies, or to select a given incident angle or range of incident angles of the incident electromagnetic energy 44. Various well known methods for coupling different polarizations, frequencies, and incidence angles of electromagnetic energy into plasmons may be employed to implement embodiments of the present invention without departing from the scope thereof.

Generally, the spectral sensitivity or responsiveness of the detector 50 is adjusted by adjusting the spacing between the features 78 and the sizes of the features 78. For the purposes of the present discussion, the spectral sensitivity of a detector represents the sensitivity or responsiveness of a detector to a predetermined frequency of incident electromagnetic energy. The spectral sensitivity of a detector is said to be adjusted when an electrical output of a detector in response to the receipt of a predetermined frequency of electromagnetic energy is adjusted. Such adjustment may occur in various ways. For example, adjustments may be achieved by varying the amount of incident energy absorbed by the detector and/or the amount of absorbed energy that is converted into electrical signals, such as electrical current and/or voltage.

The responsiveness of the detector 50 to certain polarizations of the incident electromagnetic energy 44 may be adjusted by selectively altering the overall shape of and/or the alignment of the grating 54 relative to the incident electromagnetic energy 44. For example, the disc-shaped grating 34 of FIG. 1 generally selects a broader range of polarizations than a square grating with widely spaced square or rectangular features.

The angular sensitivity or responsiveness of the detector 50 to different incident angles of the energy 44 may be adjusted by controlling the index of refraction of the grating material 54; by adjusting spacing of the surface features 78, and so on.

The detector 50 includes additional plasmon reflectors 84, which surround the detector 50 and prevent plasmons from escaping from the detector 50.

In operation, the grating 54 converts the incident electromagnetic energy 44 into plasma waves 32, and focuses or funnels the plasma waves 32 to the diode 70. The diode 70 converts the plasma waves 32 into the electrical signal 72, which is used by the integrated circuit 60 in the ROIC 58.

The detector 50 may represent one pixel in focal plane array of detectors. In the present example embodiment, bandgap control of the diode 70 is possible. The diode 70 may be implemented via relatively narrow bandgap n-type and p-type layers, such as via Mercury-Cadmium-Telluride alloys for Long Wavelength Infrared (LWIR) detection. The dielectric 56 may be implemented via a relatively wide bandgap material, such as Polyimide. The central hole or perforation 82 may be constructed via focused ion beam milling or other processes. The grating features 78, which may not be required for certain implementations and embodiments, may be etched in the grating 54 via photolithography or any other suitable techniques.

While certain photodiodes may use intrinsic bandgap materials, wherein the nominal bandgap is the difference in energy levels between the conduction band and Fermi levels, some photodiodes, which may be used for the diode 70, employ interfacial bandgaps. In such photodiodes, the nominal bandgap may correspond to the difference in Fermi level in one material on the photodiode and the valence band in the other material of the photodiode. Photons absorbed sufficiently close to the interface generate a hole that is swept across the interface to the other material. This process is limited by a hole-scattering process. Consequently, the process requires that holes be generated very close to the interface, often within 10 nm of the interface. Unfortunately, in conventional implementations, very little light is absorbed in such small distances, thereby limiting the quantum efficiency of such interfacial bandgap photodiodes.

Other than the issue of limited quantum efficiency, interfacial bandgap materials offer several advantages over other materials used to construct photodiodes. First, the bandgap can be tuned to very small value, thereby facilitating detection of longer wavelength light, by appropriate doping and/or composition control of the two materials without compromising the mechanical properties of the material combination. Second, the bandgap can also be tuned by changing the bias voltage. Third, because the choice of materials is greatly expanded, certain interfacial bandgap detectors can be fabricated with Complimentary Metal Oxide Semiconductor (CMOS) compatible processes, thereby leveraging the existing semiconductor foundries, while simultaneously targeting longer wavelengths.

However, such benefits rely upon the absorption of photons or plasmons close to the interface being sufficiently enhanced, such as via embodiments disclosed herein. The use of photon-plasmon-electron transduction, as disclosed herein, enables advantages from use of such interfacial bandgap devices, such as by increasing the field strength of the surface plasmon wave at the interface of the two materials.

Figure 4:
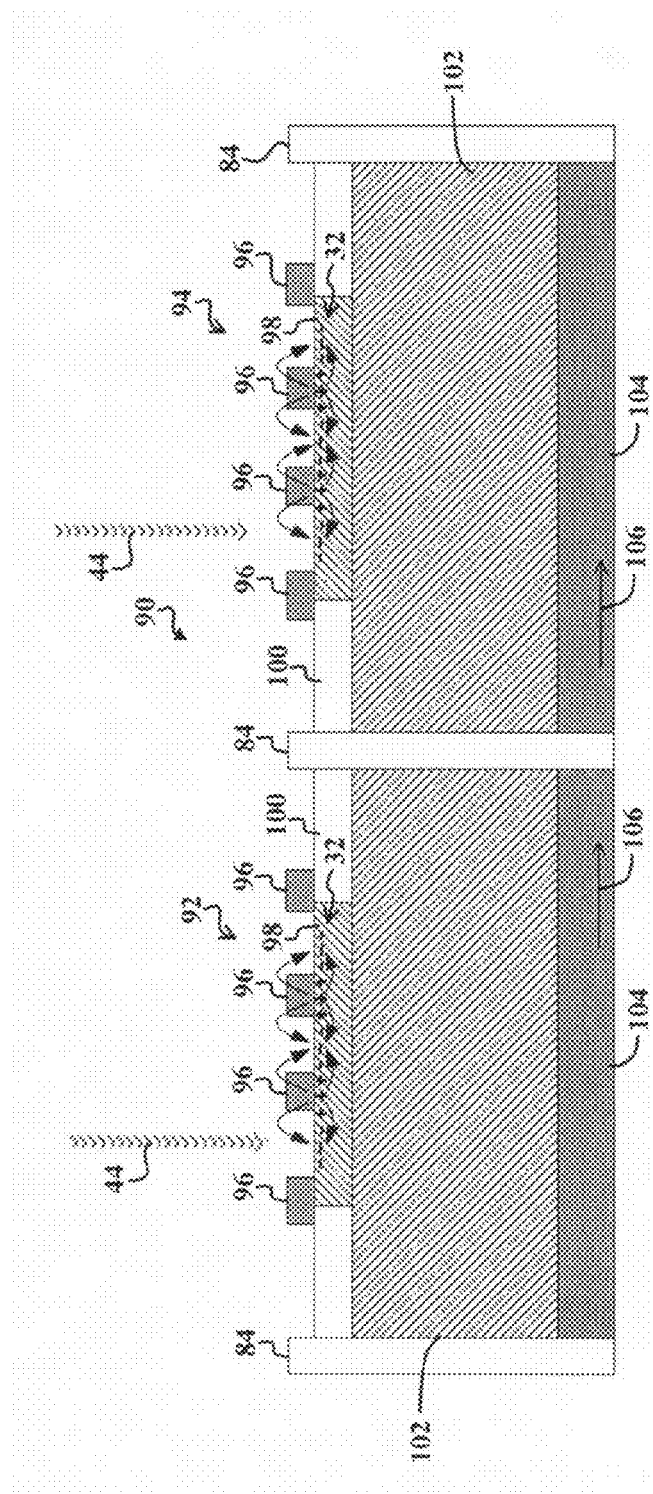
FIG. 4 is a cross-sectional diagram of a superpixel that includes two detectors according to a third example embodiment.

FIG. 4 is a cross-sectional diagram of a superpixel 90 that includes two detectors 92, 94 according to a third example embodiment of the present invention. The detectors 92, 94 represent different instances of each other. Each detector 92, includes a patterned aluminum electrode 96, disposed on a silicon-germanium (SiGe) layer 98, which is bordered by an insulating material 100. The SiGe layer 98 is disposed on a silicon substrate 102, which is backed by an electrode 104. The detectors 92, 94 are separated by plasmon reflectors 84.

In operation, incident energy 44 is coupled into plasmons 32, which are converted into an electrical signal 106 by the interface between the SiGe layer 98 and the substrate 102.

The photodiode architecture of the individual detectors 92, 94 resemble SiGe photodiodes, with the exception that the aluminum electrode 96 is patterned so as to couple in incident energy 44, such as light, into surface plasmon waves 32. Since the SPR waves 32 are confined to the Al/SiGe (or air/SiGe) interface, they will likely be absorbed by the SiGe layer 98 even if the SiGe layer 98 has nanoscale thickness. In the present example embodiment, the SiGe layer 32 is approximately 10 nm thick.

The detectors 92, 94, also called plasmon enhanced SiGe/Si photodiodes in the present embodiment, are characterized by an effective absorption length scale that is approximately the lateral or horizontal dimension, i.e., width, of the SiGe layer 98. The detectors 92, 94 are called interfacial bandgap detectors, as they employ interfacial bandgap materials, such as SiGe and silicon (Si), for detecting incident IR energy 44.

To construct the detectors 92, 94 so that they are sensitive to IR light, silicon-germanium (SiGe) and silicon (Si) -materials may be employed. In this case, the silicon substrate 102 is implanted with the 10 nm-thick SiGe layer 98. After etching and isolating the SiGe layer 98 with an appropriate insulator 100, the metal layer 96 is deposited on top. Finally, grooves are cut into the metal layer 96 so as to couple incident light energy into plasmons 32.

In this embodiment, incident IR light 44 is coupled into plasmons 32 whose energy is concentrated at the SiGe/metal interface. This ensures that the optical energy of IR wavelengths is absorbed even by thin SiGe layers. Optionally, the metal 96 also serves as one or more additional electrodes, in addition to the electrodes 104.

Figure 5:
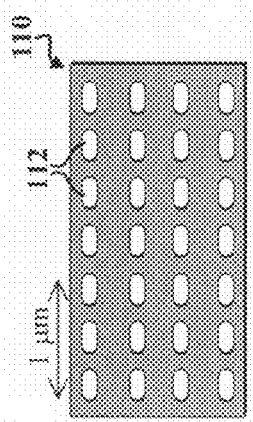
FIG. 5 is a diagram illustrating a grating of nanoholes.

FIG. 5 is a diagram illustrating a grating 110 of nanoholes 112. The grating 110 is implemented via a sheet of perforated aluminum of thickness 215±15 nm. The nanoholes 112 have a pitch of approximately 425 nm, and the aspect ratio of the hole (horizontal dimension/vertical dimension) varies from 1-3, as discussed more fully below.

Incident electromagnetic energy upon the grating 110 results in extraordinary transmission of energy through the nanoholes 112. Extraordinary transmission be the transmission of light or other electromagnetic energy through a subwavelength passage or device, i.e., a devices whose dimensions are smaller than the wavelength of the incident energy.

Figure 6:
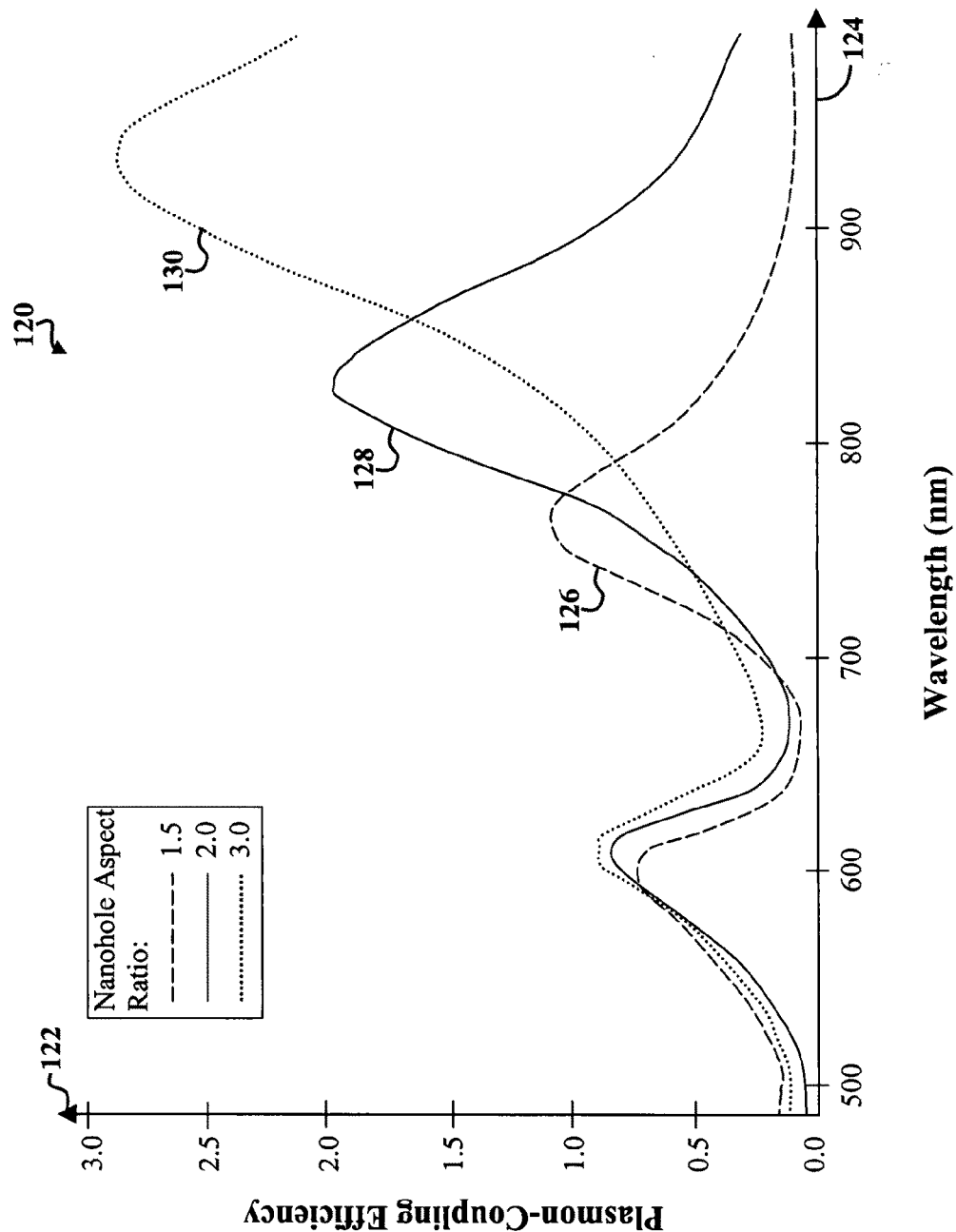
FIG. 6 is a graph illustrating the affect of grating spacing and dimensions on plasmon coupling for different frequencies of incident electromagnetic energy. Ref: K L van der Molen, et al. Physical Review B 2005, 72, 045421.

FIG. 6 is a graph 120 illustrating the affect of grating spacing and dimensions on plasmon coupling for different frequencies of electromagnetic energy incident upon the nanohole grating 110 of FIG. 5.

With reference to FIGS. 5 and 6, the graph 120 includes a vertical axis 122 depicting the transmissivity of the nanohole grating 110, and a horizontal axis 124, depicting wavelength of incident electromagnetic energy. The transmissivity of the nanohole grating 110 may represent a transmission-enhancement factor due to the grating 110 or plasmon-coupling efficiency.

A first curve 126 represents the response, i.e., the plasmon-coupling efficiency of the nanohole grating 110 when the nanoholes 112 have an aspect ratio (the horizontal dimension divided by the vertical dimension) of approximately 1.5. A second curve 128 represents the plasmon-coupling efficiency of the nanohole grating 110 when the nanoholes 112 have an aspect ratio of approximately 2.0. A third curve 130 represents the plasmon-coupling efficiency of the nanohole grating 110 when the nanoholes 112 have an aspect ration of 3.0.

The graph 120 illustrates that wavelength sensitivity of a grating, and consequently, an accompanying detector, may be varied by adjusting certain dimensions of the grating.

Figure 7:
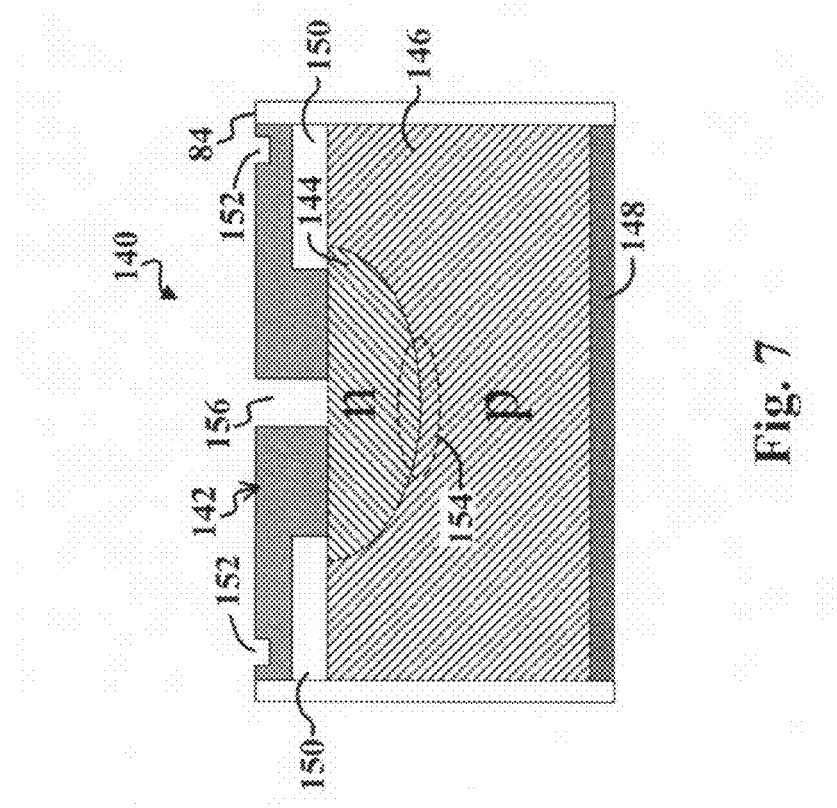
FIG. 7 is a cross-sectional diagram of a detector adjusted for sensitivity to a particular wavelength of electromagnetic energy according to a fourth embodiment of the present invention.

FIG. 7 is a cross-sectional diagram of a detector 140 adjusted for sensitivity to a particular wavelength of electromagnetic energy according to a fourth embodiment of the present invention. The detector 140 includes a wavelength-tuned grating 142, with slots 152 cut therein to cause the detector 140 to be responsive to a certain wavelength of incident energy. The grating 142 is isolated from a p-type substrate 146 via an insulating spacer 150. Between opposite ends of the spacer 150, the grating 142 contacts an n-type region 144 formed in the substrate 146. The interface between the n-type region 144 and the p-type region 154 represents a pn-junction, in which an active region forms 154 during conversion of plasmons to electrical current. The detector 140 is partially surrounded by a plasmon reflector 84.

A central perforation 156 in the grating 142 opens above the n-type-region 144 and acts to confine the generation of electron-hole pairs to the n-type-region of the detector 140. This focusing and confinement of the generation of electron-hole pairs to a small region in the n-type silicon virtually eliminates the undesirable pixel cross_talk as discussed with respect to FIG. 1 above. The central perforation 156 is a nanohole. A nanohole may be any perforation with dimensions smaller than the wavelength of incident electromagnetic energy to be detected by a detector, such as the detector 140.

Figure 8:
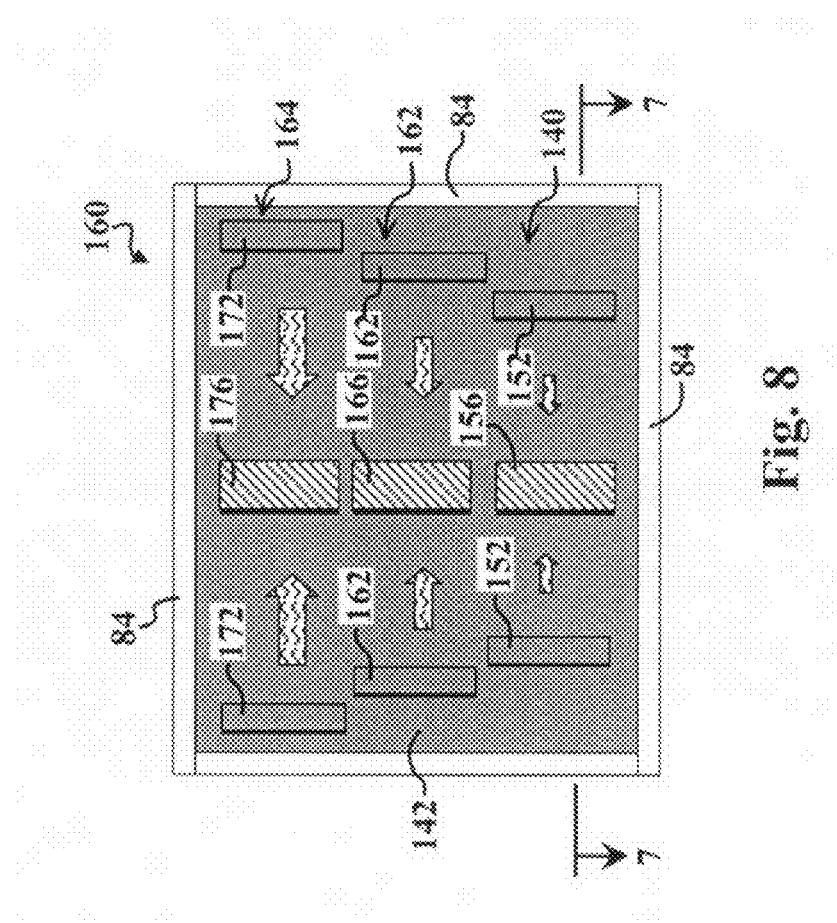
FIG. 8 is a top view of a superpixel, according to a fifth embodiment of the present invention, which includes different detectors tuned for sensitivity to different wavelengths or ranges of wavelengths of incident electromagnetic energy.

FIG. 8 is a top view of a superpixel 160, according to a fifth embodiment of the present invention, which includes different detectors 140, 162, 164, which are tuned for sensitivity to different wavelengths or ranges of wavelengths of incident electromagnetic energy. The tuning of wavelength sensitivity is achieved by adjusting the spacing between grating grooves 152, 162, 172. Similar sensitivity adjustments may be made by adjusting the aspect ratios of the slots or slots 152, 162, 172, as illustrated in the graph 120 of FIG. 6.

The superpixel 160 represents a group of pixels, with each pixel tuned for a specific wavelength or range of wavelengths of incident electromagnetic energy. In the example superpixel 160 of FIG. 8, shorter wavelengths of incident energy are selected by use of shorter spacings between the grooves or slots 152, 162, 172 in the grating material 142. Hence, the superpixel 160 may simultaneously detect light of three different wavelength bands. Note that superpixels including more than three sub-detectors may be employed without departing from the scope of the present invention. Furthermore, superpixels with sub-detectors that are responsive to different polarizations, incident-energy angles, wavelengths, and combinations thereof may be implemented in accordance with the present teachings. Furthermore, such superpixels may be incorporated into arrays of superpixels, as discussed more fully below.

Use of such adjacent detectors 140, 162, 164, also called pixels, may enhance image information and capabilities of an accompanying imaging system. For example, an array for sensing IR, optical, microwave, and other frequencies may be employed to generate a robust image.

The photon-plasmon coupling in the superpixel 160 is a function of wavelength. Thus, the superpixel 160 can be made to respond to specific wavelengths without requiring an external element, such as a filter, that would selectively transmit those wavelengths. Further, since the absorption cross section of a resonant nanostructure (which can be used to selectively couple light of a particular wavelength into plasmons) can be larger than the physical dimensions of the nanostructure, two or more adjacent plasmon enhanced photodiode pixels can be made to collect optical energy from the same (or nearly the same) incident area, but from different wavelengths as shown in FIG. 8.

Note that grating groove spacings couple in light of different wavelengths into plasmons. Thus, the three different spacings shown in FIG. 8 couple in different wavelengths (shown by arrows of different sizes) into three different central areas 156, 166, 176, wherein three different active elements are placed. The effect of grating spacing on the photon/plasmon coupling can bee seen with reference to FIGS. 5 and 6.

While the present embodiment is discussed with respect to the selective coupling of light of different wavelengths, note that photodiodes that respond to photons incident from within certain angular ranges may be readily achieved via methods disclosed herein.

This results from the fact that certain photon-plasmon coupling efficiency is a function of the incident angle of input electromagnetic energy. Thus, plasmon enhanced photodiodes wherein the photodiode responds to light incident from particular incident angles is readily achieved by manipulating the grating accompanying the detector. Such photodiodes can be used to eliminate the need for a lens.

Furthermore, photodiodes, superpixels, and accompanying arrays that are responsive to different polarizations are readily achievable. The photon-plasmon coupling efficiency can also be a significant function of incident polarization. Further, as was the case with photodiodes that respond to different wavelengths, one can design a set of photodiodes that responds to different polarizations of light incident on the same or similar collection area.

Thinned active layers employed in certain embodiments disclosed herein, such as the active layer 98 of the detectors 92, 94 of FIG. 4, demonstrate a high-speed response. This is because electron-hole pairs, once they are generated, travel at a finite speed, and are collected more rapidly if the active layer is thin. Thus, the certain photodiode architectures presented herein have significantly faster response times as compared to conventional photodiodes. This faster response time can be used effectively in applications such as Laser Radar (LADAR) receivers.

Figure 9:
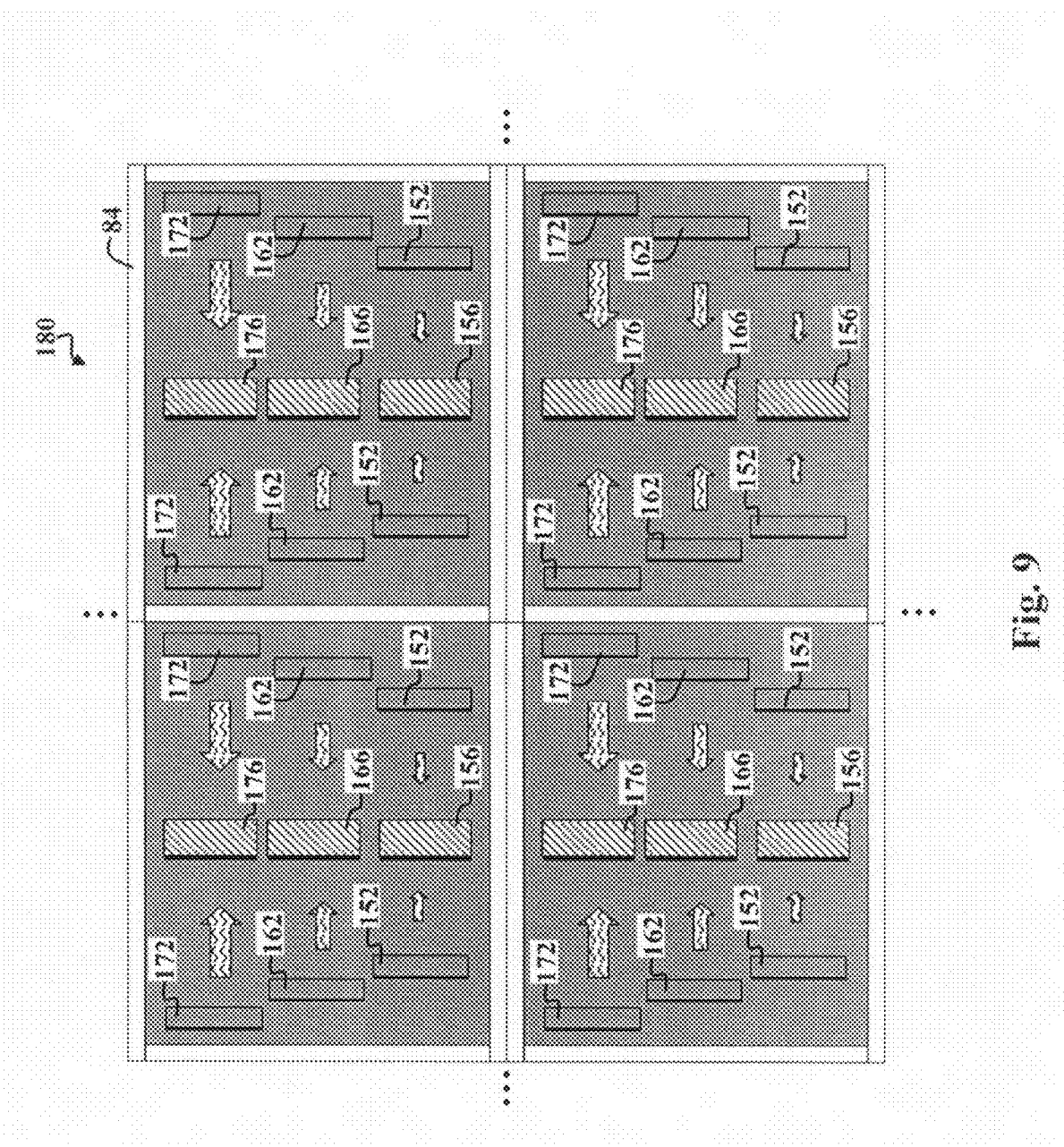
FIG. 9 is a top view of an array of superpixels according to a sixth embodiment of the present invention.

FIG. 9 is a top view of an array 180 of superpixels according to a sixth embodiment of the present invention.

In an imaging array of photodiodes or other energy detectors, the ultimate limit for pitch is governed by the wavelength of incident light, since a photodiode with dimensions less than the wavelength will be nearly transparent to the incident light. Use of the enhanced photodiode architecture described herein may significantly reduce the ultimate limit for photodiode pitch.

Photodiode pitch limitations are often influenced by several other factors. One of the critical factors is the diffusion length scale of the electron-hole pairs, as illustrated by the random path 18 shown in FIG. 1. In an example photodiode, some of the incident light is absorbed outside the depletion region at the n/p interface. The resultant electron-hole pairs can diffuse randomly in any direction; and will have a high likelihood of being collected at the electrodes for a neighboring pixel if the pixel pitch is less than the diffusion length scale. This phenomenon blurs the resolution of the imaging array. One way to circumvent this problem involves using a microlens array and guard plates to prevent light absorption outside the active layer. However, a microlens array and/or guard plates are themselves subject to the limits of diffraction and fabrication. The net result is that the pitch in current imaging arrays of photodiodes is often greater than the wavelength of light, such as by a factor of two or more. Use of a resonant nanohole and/or surface plasmon/phonon resonance to funnel all the incident light energy to the interface of an n/p photodiode, as discussed herein, may prevent any absorption of the incident energy in regions where the resolution is blurred. For instance, with respect to FIG. 3, the depletion region 74 at the n/p interface, also called pn-junction 76, is defined by the dashed region 76. In certain photodiodes, photoabsorption would occur outside the depletion region 76, but in the plasmon-enhanced photodiode 50 of FIG. 3, for instance, it can be easily ensured that absorption occurs within the depletion region 76 only.

Another implementation for limiting photoabsorption to a depletion region is shown in FIGS. 7 and 9, wherein the depletion region 154 extends around the n/p interface defined by the n-type region 144 and p-type region 146. To the extent that electron-hole pair generation is restricted to the n-type region 144 (which could also be the p-type region if the n-type and p-type regions are switched), then the resultant electron-hole pairs will not be collected by an electrode of a neighboring pixel.

Exact materials and dimensions of various components employed to implement embodiments of the present invention are application specific. Those skilled in the art with access to the present teachings may readily employ desired materials to meet the needs of a given application.

Although the invention has been discussed with respect to specific embodiments thereof, these embodiments are merely illustrative, and not restrictive, of the invention. In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow "a", an and "the" include plural references unless the context clearly dictates otherwise. Furthermore, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances, some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications and embodiments within the scope of the present invention.

Accordingly,

What is claimed is:

1. An energy converter comprising:
a receiver for receiving a first type of energy or signal and providing one or more plasmons in response thereto and
a detector coupled to the receiver, wherein the detector is adapted to convert the one or more plasmons into a second type of energy or signal; wherein the second type of energy or signal includes an electrical signal; and wherein the detector includes a pn-junction.

2. An energy detector comprising:
a photo-plasmon converter, wherein the photo-plasmon converter includes a grating with selectively spaced apertures to couple incident electromagnetic energy of different wavelength ranges into plasmons or plasma waves and
a plasmon-electron converter coupled to the photo-plasmon converter.

3. An energy detector comprising:
a photo-plasmon converter and
a plasmon-electron converter coupled to the photo-plasmon converter wherein the plasmon-electron converter includes a pn-junction.

4. The energy detector of claim 3 wherein the pn-junction is positioned relative to the photo-plasmon converter so that generation of electron-hole pairs in the pn-junction is confined to a depletion region of the pn-junction.

5. An energy-converting apparatus comprising:
a conductor grating, wherein the conductor grating includes means for affecting sensitivity or responsiveness of the energy-converting apparatus to a particular polarization of the incident electromagnetic energy and
a semiconductor material coupled to the conductor grating, wherein the semiconductor material includes an interfacial bandgap.

6. An energy detector comprising:
first means for converting incident electromagnetic energy into one or more plasmons;
second means for generating an electrical signal based on the one or more plasmons; and
fourth means for controlling spectral sensitivity of the energy detector.

7. The energy detector of claim 6 wherein the electromagnetic energy includes one or more photons.

8. The energy detector of claim 7 wherein the second means includes an active element.

9. The energy detector of claim 8 wherein a spatial dimension of the active element is smaller than a wavelength of the incident electromagnetic energy.

10. The energy detector of claim 8 wherein the first means includes SiGe.

11. The energy detector of claim 8 wherein the first means includes an interfacial bandgap.

12. The energy detector of claim 7 wherein the first means includes a grating material coupled to a first semiconductor layer.

13. The energy detector of claim 7 further including fifth means for controlling sensitivity or responsiveness of the detector to a particular polarization of the incident electromagnetic energy.

14. The energy detector of claim 7 further including an array of the detectors, wherein the array is tuned to be responsive to a predetermined frequency or range of frequencies of incident electromagnetic energy.

15. The energy detector of claim 14 further including an array of the detectors, wherein the array includes a group of detectors that includes a first detector that is responsive to a first frequency or range of frequencies of electromagnetic energy, and a second detector that is responsive to a second frequency or range of frequencies of electromagnetic energy that is different from the first frequency or range of frequencies of electromagnetic energy.

16. The energy detector of claim 15 wherein the array includes plural instances of the group of detectors.

17. The energy detector of claim 6 wherein the first means includes a grating with perforations extending therethrough.

* * * * *